United States Patent
Lee

(10) Patent No.: US 8,307,229 B2
(45) Date of Patent: Nov. 6, 2012

(54) METHOD OF MEASURING POWER CONSUMPTION OF ELECTRIC APPLIANCE

(75) Inventor: Kangwon Lee, Changwon-si (KR)

(73) Assignee: LG Electronics Inc., Seoul (KR)

( * ) Notice: Subject to any disclaimer, the term of this patent is extended or adjusted under 35 U.S.C. 154(b) by 228 days.

(21) Appl. No.: 12/842,403

(22) Filed: Jul. 23, 2010

(65) Prior Publication Data

US 2011/0145611 A1 Jun. 16, 2011

(30) Foreign Application Priority Data

Dec. 16, 2009 (KR) .................. 10-2009-0125391

(51) Int. Cl.
*G06F 1/26* (2006.01)

(52) U.S. Cl. .......................................... 713/320; 702/60
(58) Field of Classification Search .......... 713/300–320, 713/323–340; 702/60–62; 700/295–296
See application file for complete search history.

(56) References Cited

U.S. PATENT DOCUMENTS 7,561,977 B2 * 7/2009 Horst et al. .................... 702/62

* cited by examiner

*Primary Examiner* — Clifford Knoll
(74) *Attorney, Agent, or Firm* — KED & Associates, LLP

(57) ABSTRACT

A method of measuring power consumption of an electric appliance is provided. The method may include determining an operation mode of the electric appliance, extracting power consumption data corresponding to the determined operation mode of the electric appliance, and calculating an integrated power consumption based on the extracted power consumption data and the operation time of the electric appliance.

10 Claims, 7 Drawing Sheets

FIG. 5

| | First Operation Mode Power Consumption | Second Operation Mode Power Consumption | Third Operation Mode Power Consumption |
|---|---|---|---|
| Refrigerator | 400W | 330W | 305W |
| Air Conditioner | 1800W | 1650W | 1500W |
| Washer /Dryer | 2800W | 2500W | 2100W |
| Cooking Appliance | 18,000W | 17,000W | 15,000W |
| Lighting Applicance | 150W | 130W | 110W |

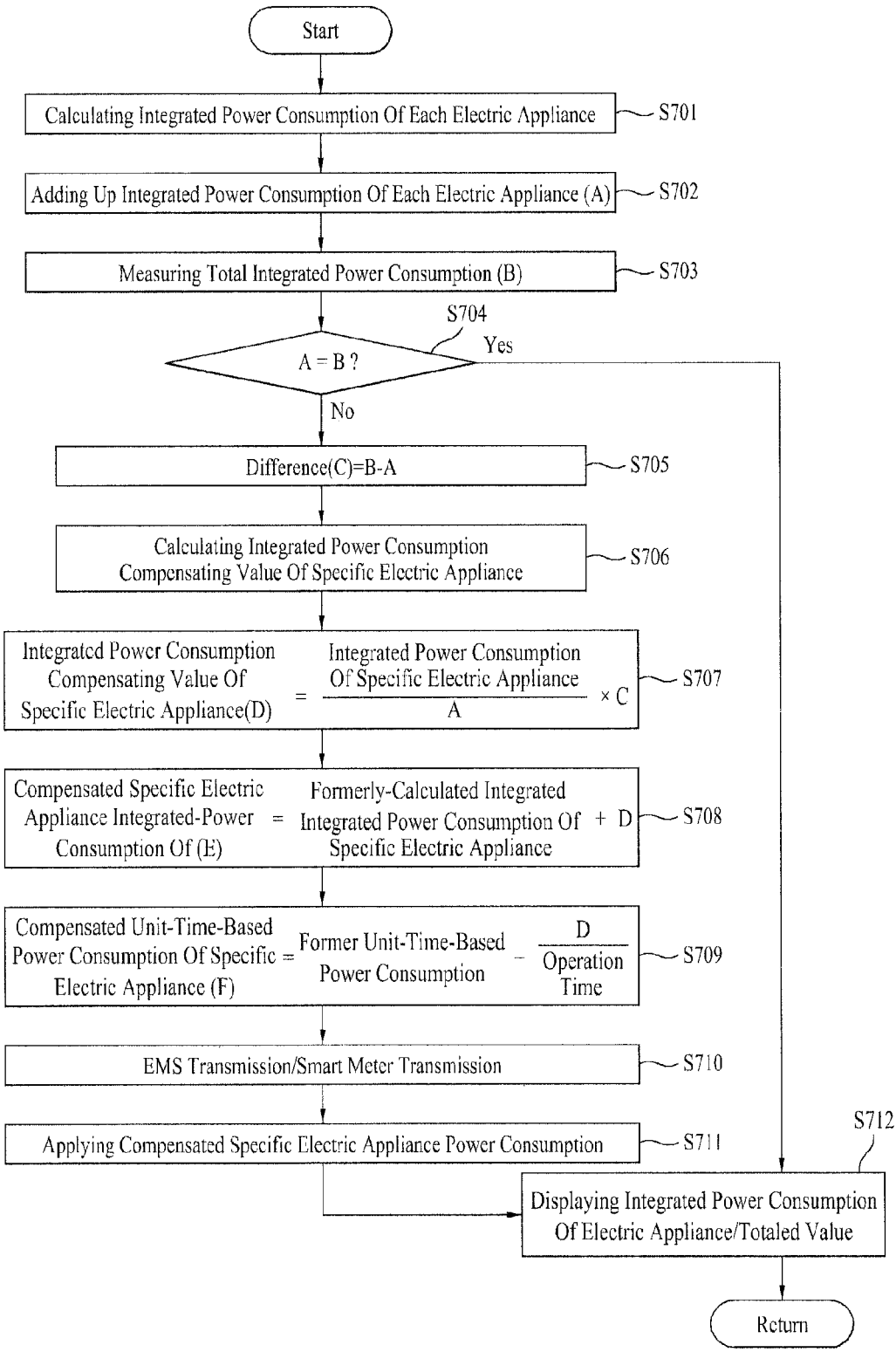

METHOD OF MEASURING POWER CONSUMPTION OF ELECTRIC APPLIANCE

CROSS-REFERENCE TO RELATED APPLICATION(S)

This application claims priority under 35 U.S.C. §119 to Korean Application No. 10-2009-0125391 filed in Korea on Dec. 16, 2009, whose entire disclosure is hereby incorporated by reference.

BACKGROUND

1. Field

This relates to a system and method of measuring power consumption.

2. Background

The power required to operate various devices, such as, for example, home or commercial electric appliances, may be supplied by an electric power supplier via, for example, transmission lines and distributed wires. Electric power may be centrally generated and then distributed via a radial-type structure. Power generation technology and associated equipment may be analog or electromechanical and thus may rely on manual restoration when an accident occurs. It may be difficult to provide rate and usage based incentives to consumers when power rates are fixed.

BRIEF DESCRIPTION OF THE DRAWINGS

The embodiments will be described in detail with reference to the following drawings in which like reference numerals refer to like elements wherein:

FIG. 5 is a table of exemplary electric power consumption per unit time for exemplary electric appliances;

FIG. 7 is a flow chart of a process of calculating total electric power consumption and a process of compensating for electric power consumption or a unit-time basis, in an electric power supply network system as embodied and broadly described herein.

DETAILED DESCRIPTION

Smart Grid is a next-generation electric power system combining modernized electric power technology and information communicational technology. In contrast to a vertically stacked, centralized supplier based system, Smart Grid may provide a more horizontal, collaborative and distributive network that facilitates consumer and supplier communication. In this system, electric appliances, power storage devices and distributed electric power may all be connected with a network to enable the consumer and the supplier to communicate with each other. Thus, Smart Grid may sometimes be referred to as the 'Energy Internet'.

In order to implement Smart Grid on the part of a consumer in, for example, a home or building, a network connected with one or more electric appliances may be used to implement two-way communications with an electric power supplier. Such two way communication between the supplier and consumer may facilitate the establishment of a home or business electric power supply network system and a corresponding managing method that may allow power rates to be provided to the consumer in real-time. This real time rate information may allow the consumer to refrain from using the electric appliances during peak-time, if possible, or to manage usage to reduce costs accordingly.

Measurement and calculation of power consumption and power rates during particular usage periods may be used to make such a determination. This may be done by installing a measuring device on each of the electric appliances to measure power consumption for each individual electric appliance. However, use of multiple measuring devices may be inconvenient, complicated and costly.

Figure 1:
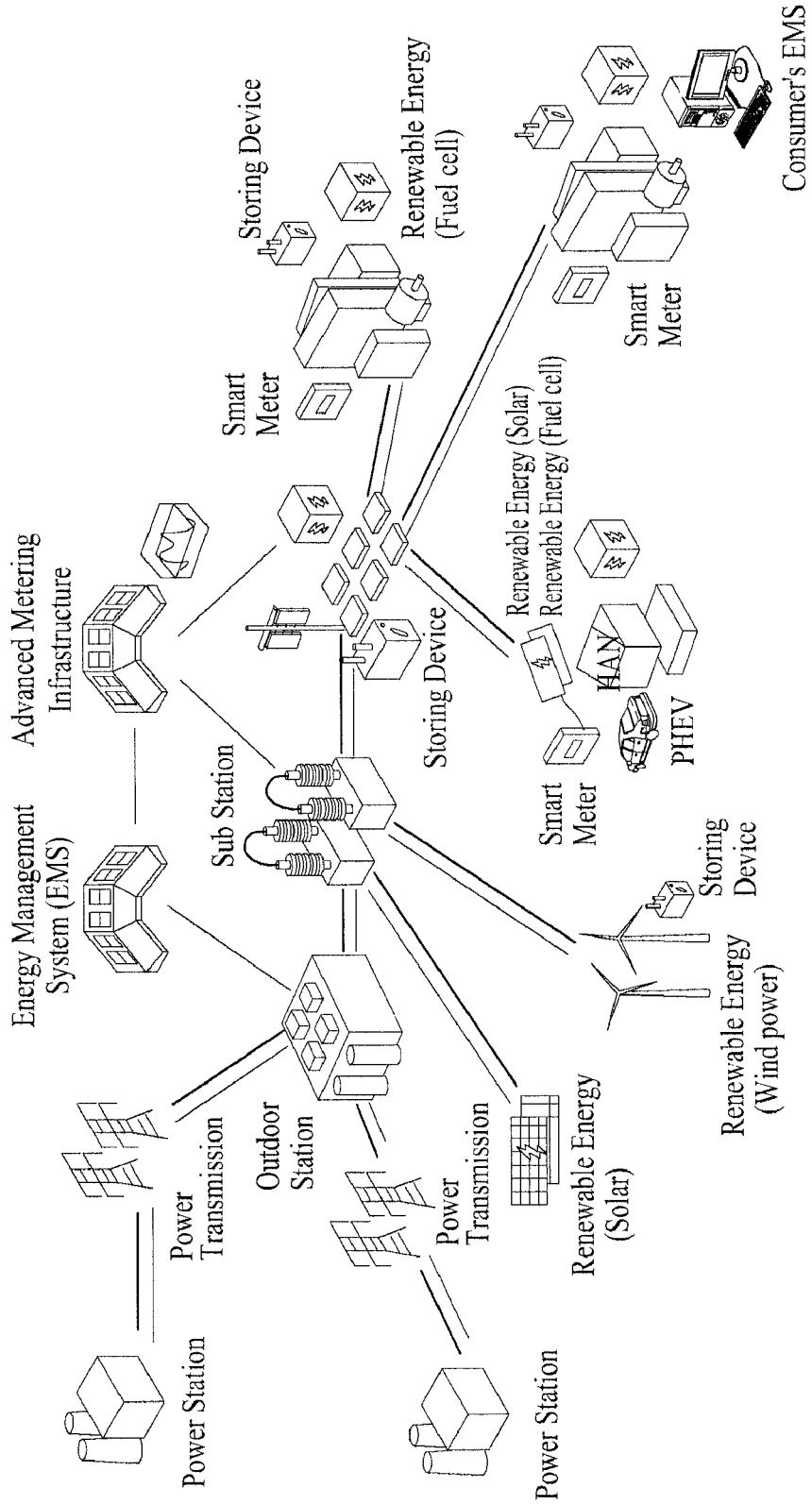
FIG. 1 is a schematic diagram of an exemplary Smart Grid system.

As shown in FIG. 1, a Smart Grid system may include an electric power station for generating electricity. The power station may use, for example, nuclear power generation or hydroelectric power generation, solar power or wind power which use renewable energy such as sunlight and wind power, or other energy sources as appropriate.

A nuclear power station or hydroelectric power station may transmit electricity to an outdoor station via, for example, a power cable, and the outdoor station may transmit the electricity to a substation for distribution to consumers. Electricity generated by renewable energy sources may be transmitted to the substation for distribution to consumers via, for example, an electric power storage device. Households using a Home Area Network (HAN) may generate and supply electricity locally using, for example, sunlight and a fuel cell mounted in a PGEV (Plug in Hybrid Electric Vehicle), and, in certain circumstances, may sell any remaining, unused electricity to other consumers.

With a smart metering infrastructure, an office or household may monitor the amount of electric power and power rates used in order to reduce power consumption or power rates depending on the circumstances. Duplex transmission capability may allow such a power station, outdoor station, storage device and consumer facilities to exchange information related to their particular circumstances or power needs so that electricity generation and electricity distribution may be conducted accordingly.

An EMS (Energy Management System) may be employed for real-time electric power management and real-time power consumption prediction and an AMI (Advanced Metering Infrastructure) may be employed for real-time metering of the power consumption in the Smart Grid.

The AMI may integrate consumers based on open architecture, enable consumers to use electricity efficiently, and allow electric power suppliers to detect errors in the system. In certain embodiments, the open architecture may connect all kinds of electric appliances to each other in Smart Grid, regardless of individual manufacturers thereof. As a result, the metering infrastructure used in the Smart Grid may allow for consumer-friendly efficiency and functionality such as 'Prices to Devices'.

That is, a real-time price signal of the current electric power market may be delivered via the EMS installed in each consumer facility, and the EMS may communicate with each of the electric appliances under its control. As a result, the consumer may be made aware of electric power consumption, and corresponding power rate (i.e., cost to operate), of each electric appliance after seeing the EMS, and may implement an appropriate action, such as, for example, setting power consumption limits or setting power-rate limits based on the power information.

The EMS may be, for example, a local EMS used in an office or household, or a central EMS for processing information acquired by the local EMS.

The real-time communication of electric power information between the supplier and consumer provides for 'real-time Grid response', and for high costs generated by use of electric appliances at times of peak demand to be reduced.

Figure 2:
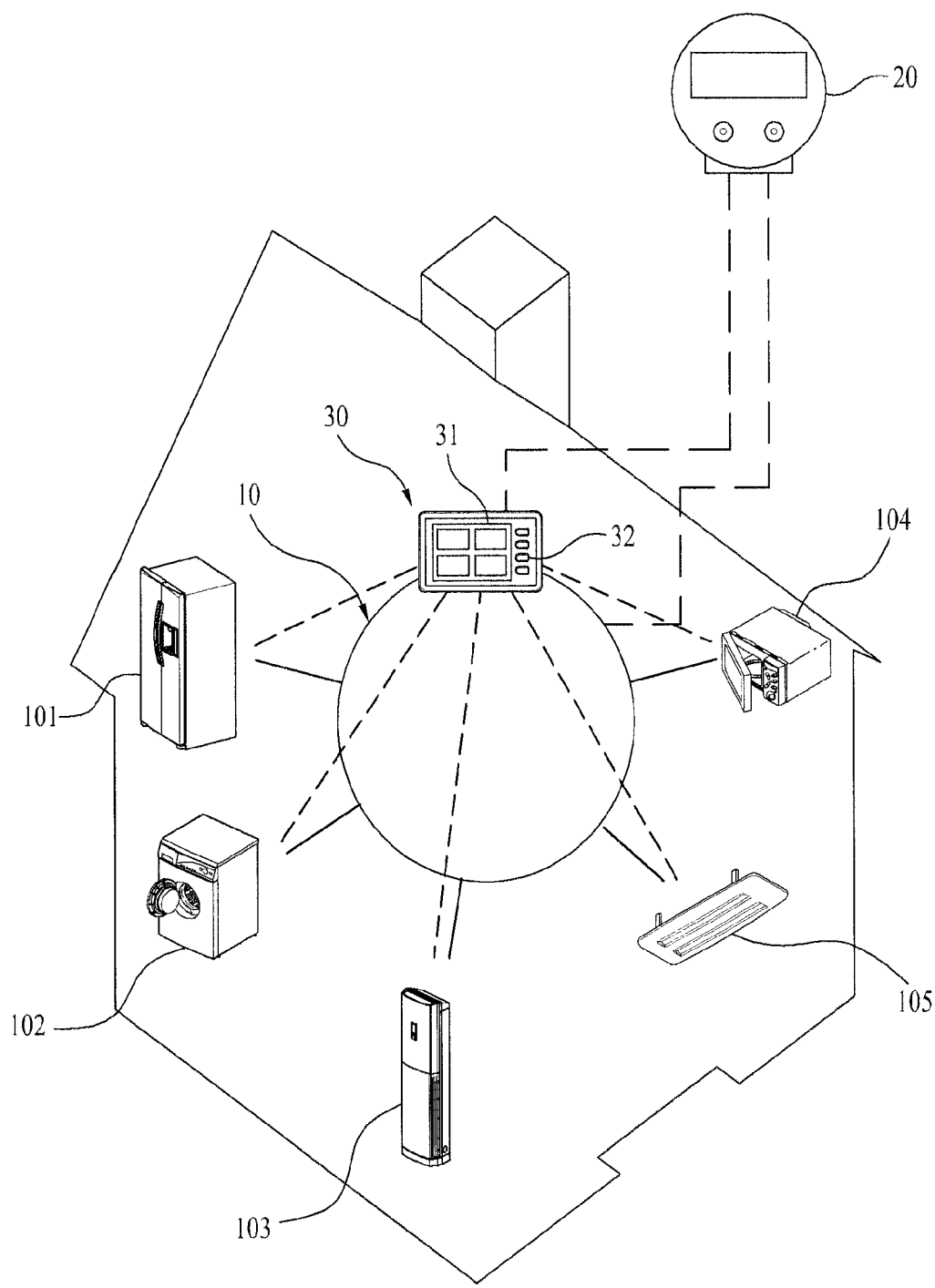
FIG. 2 is a schematic diagram of an exemplary networked electric power supply system as embodied and broadly described herein.

The electric power supply network 10 shown in FIG. 2 may include a smart meter 20 capable of measuring the electric power supplied to a consumer facility, such as, for example, a household, and the corresponding power rates at particular usage times. An energy management system (EMS) 30 connects the smart meter 20 to a plurality of electric appliances 101-105 to control operations of the smart meter 20 and the electric appliances 101-105.

In many systems, power rates may be billed based on a pay-by-usage time system. Such pay-by-time power rates may increase significantly during hours of significantly increased electric power consumption (i.e., peak), and may decrease during hours having relatively less power consumption (i.e., non-peak).

The EMS 30 may include a screen 31 for displaying various information, such as, for example, current electricity consumption and an external environment (e.g. temperature and humidity). The EMS 30 may be a terminal including a button-type input device 32 that may receive user input.

The EMS 30 and the smart meter 20 may be connected to electric appliances including, for example, a refrigerator 101, washer and dryer 102, air conditioner 103, cooking appliance 104, lighting appliance 105, and the like, allowing for two way communication with the appliances 101-105. Communication inside the house may be implemented via wireless or wired system, such as, for example, power line communication (PLC). In certain embodiments, each of the electric appliances 101-105 may also be connected with the other electric appliances 101-105 to implement communication therebetween.

Figure 3:
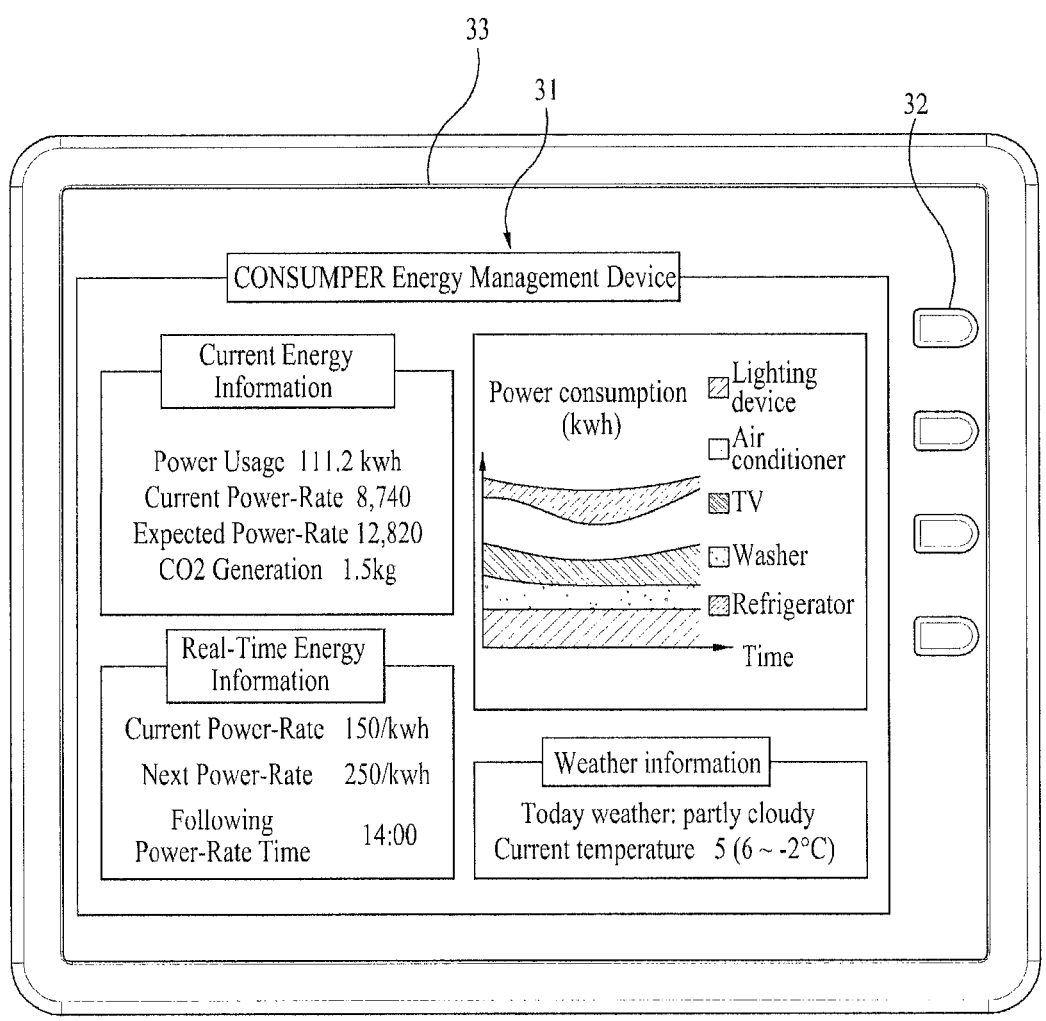
FIG. 3 is a front view of an energy management device shown in FIG. 2.

As shown in FIG. 3, the EMS 30 may include a display including a screen 31 that displays real-time energy information including, for example, a current electric power consumption, a current power-rate, an expected power-rate based on, for example, a cumulative history, current date energy information such as carbon dioxide generation, a power-rate in a current time period, a power-rate in the next time period and a time period having a changing power-rate, and weather information.

The screen 31 of the display 33 may display a graph showing electric power consumption by each electric appliance over a time period and changes in the electric power consumption, and/or an electric power-rate change graph for each time period. Other arrangements of information on the screen 31 may also be appropriate.

The input device 32 may be provided in a predetermined portion of the screen 31 for the user to set operation modes of the electric appliances. For example, the user may use this input device 32 to set, either on an individual appliance basis, or on an in-total basis, a desired electric power consumption (i.e., limit electric power consumption), or to limit the allowable power-rate. The EMS 30 may control the operation of each electric appliance based on the user's setting.

Figure 4:
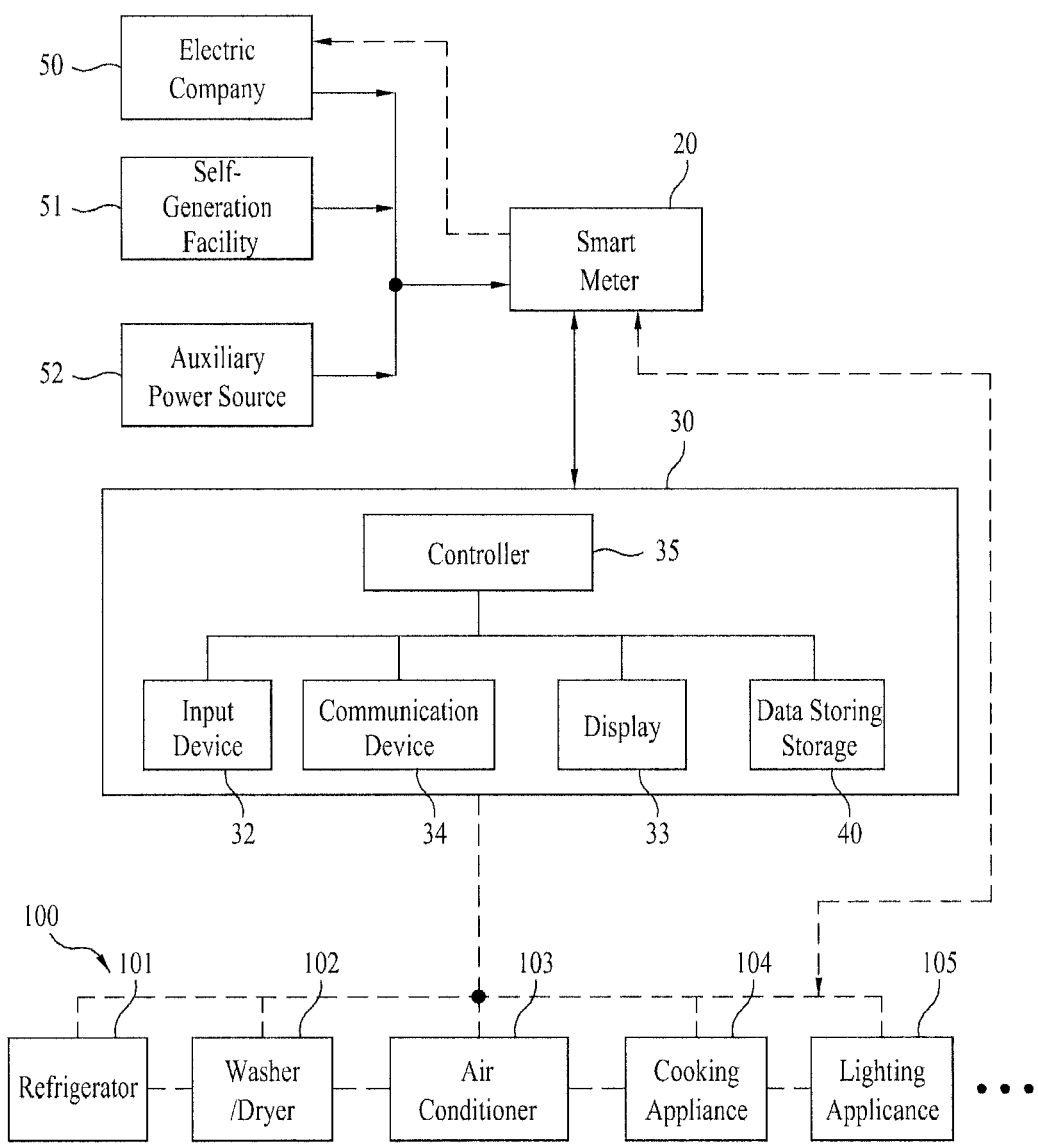
FIG. 4 is a block diagram of an electric power supply network system.

FIG. 4 is a block diagram an electric power supply source connected to an electric power supply network system used to supply the electric power to the electric appliances installed in a consumer facility, such as, for example, a household, using Smart Grid system. It is noted that, simply for ease of discussion, the consumer facility will be assumed to be a home, and the electric appliances to be managed by the smart grid will be electric household/domestic appliances. However, it is well understood that the principles and concepts set forth herein may be applied to numerous different types of consumer facilities (offices, factories, stores, schools and the like) and associated electric devices used herein.

The electric power supply source may include a system power supply 50 supplied by a conventional power generation facility that produces thermal, nuclear and/or hydroelectric power, a renewable energy supply 51 supplied by a self-generation facility, such as wind or solar power generation, and/or an auxiliary power supply 52 such as, for example, a fuel-cell or storage battery.

The renewable energy supply 51 may be installed in a consumer facility or it may be a solar power generation facility or wind power generation facility installed in a complex. Other renewable energy supply systems may also be appropriate.

The auxiliary power supply 52 may be, for example fuel cell, and may be similar to those installed in a vehicle, or may be a storage battery capable of storing the electric power supplied from another power supply. Other auxiliary power supply systems may also be appropriate.

One or more of these sources of power may be connected to the smart meter 20, and the smart meter 20 may be connected to the EMS 30. The EMS 30 may include a controller 35, an input device 32, a communication device 34, a display 33 and a data storage 40.

The communication device 34 may communicate with one or more electric appliances 100 including, for example, a refrigerator 101, a washer or dryer 102, an air conditioner 103, a cooking appliance 104 and/or a lighting appliance 105, which may be installed in consumer facility, such as, for example, a household, and may transmit/receive electric power information and driving information related to the electric appliances 100.

The controller 35 of the EMS 30 may recognize setting information inputted by the user via the input device 32, cumulative history information on the operations of the electric appliances 100 and electric power consumption history information and external electric power supply, in real-time. Then, the controller 35 may process the variety of information in real-time, to control the operations of the electric appliances 100 and to control the electric power supplied to the electric appliances 100.

The display 33 may display the electric power information supplied by the electric power supply and operational information of the electric appliances 100.

The data storage 40 may store the setting information inputted by the user via the input device 32, the cumulative history information on the operations of the electric appliances 100 and the electric power consumption history information and external electric power supply therein.

As shown in FIG. 5, the data storage 40 may store a table including, for example, a power consumption amount per hour (or other unit as appropriate) in each operation mode of each electric appliance. The EMS 30 may control the operations of the electric appliances and, more specifically, may control each electric appliance to be operated in an operation mode based on power-rate saving (i.e., cost savings) and/or power consumption saving. The smart meter 20 may be connected with each of the electric appliances 100 to measure total integrated power consumption, and not necessarily individual power consumption for each electric appliance. The smart meter 20 may also include a controller, a data storage and a display configured to display electric power information such as power consumption in a household.

The exemplary power consumption table shown in FIG. 5 may be provided in the EMS 30 or in a memory (not shown) of each respective electric appliance.

Not only the EMS 30 but also the smart meter 20 may extract power consumption data from the table based on the operation mode of each electric appliance, and may calculate power consumption for each electric appliance and display the calculated value.

As shown in FIG. 5, each table may include power consumption for each electric appliance in each operation mode. In the exemplary table shown in FIG. 5, a unit of power consumption is a Watt (W) and a unit of time is 1 second. Other units may also be appropriate, based on the type of consumer facility and the types of electrical appliances/machinery in operation.

Power consumption for each operation mode for each appliance may be the sum of power consumptions of each element included in each electric appliance.

For example, the power consumption of the refrigerator in a given mode may be the sum of power consumptions of a compressor, a condensation fan motor, a defrosting heater and a cold air fan of the refrigerator in the given mode. Similarly, the power consumption of the washer may be the sum of power consumptions of a rotatable-drum motor, wash water supply valve and a heater. Power consumption of the air conditioner may be the sum of power consumptions of a compressor, an outdoor unit fan motor and an indoor unit fan. Power consumption of an electric oven may be the sum of power consumptions of a convection fan motor and a heater. Power consumption of the lighting appliance may be the sum of power consumption of one or more lamps and switches.

The first, second and third operation modes shown in FIG. 5 may be, for example, an energy saving operation mode implemented by the EMS 30, a normal operation mode in which the appliance is operated irrespective of energy saving, and a power-rate saving operation mode set to avoid operation in a peak-time having the highest power-rate billed therein. Additional and/or other modes may also be appropriate.

A method of determining power consumption of a specific electric appliance will now be described with reference to FIG. 6.

First, a specific electric appliance is put into operation (S601) and it is determined which operation mode is currently selected (S602). When one of the first, second or third operation modes is selected, the power consumption per unit time for the appropriate electric appliance in the appropriate operation mode may be determined from the table shown in FIG. 5 (S603, S604 and S605).

When the power consumption per unit time for the electric appliance determined from the table is multiplied by the operation time in the appropriate operation mode, the power consumption used during the operation time may be calculated (S606). For example, if the air conditioner is operated in the first operation mode for 5 hours and in the second operation mode for 2 hours and in the third operation mode for 1 hour, sequentially, the total power consumption of the air conditioner for this 8 hour period may be calculated based on 1800(W)×5(time)+1650(W)×2(time)+1500(W)×1(time) =13.8 Kwh. In this situation, a calculation interval of the power consumption may be, for example, 0.5 or 1 second, or other interval as appropriate.

Integrated power consumption of each of the other electric appliances may be calculated in a similar manner. The calculated power consumption is displayed on the EMS 30 and the EMS 30 notifies the user of the calculated power consumption (S607). In this case, the EMS 30 may display daily-based integrated power consumption of each electric appliance and integrated power consumption and power-rate for a predetermined time period.

Figure 6:
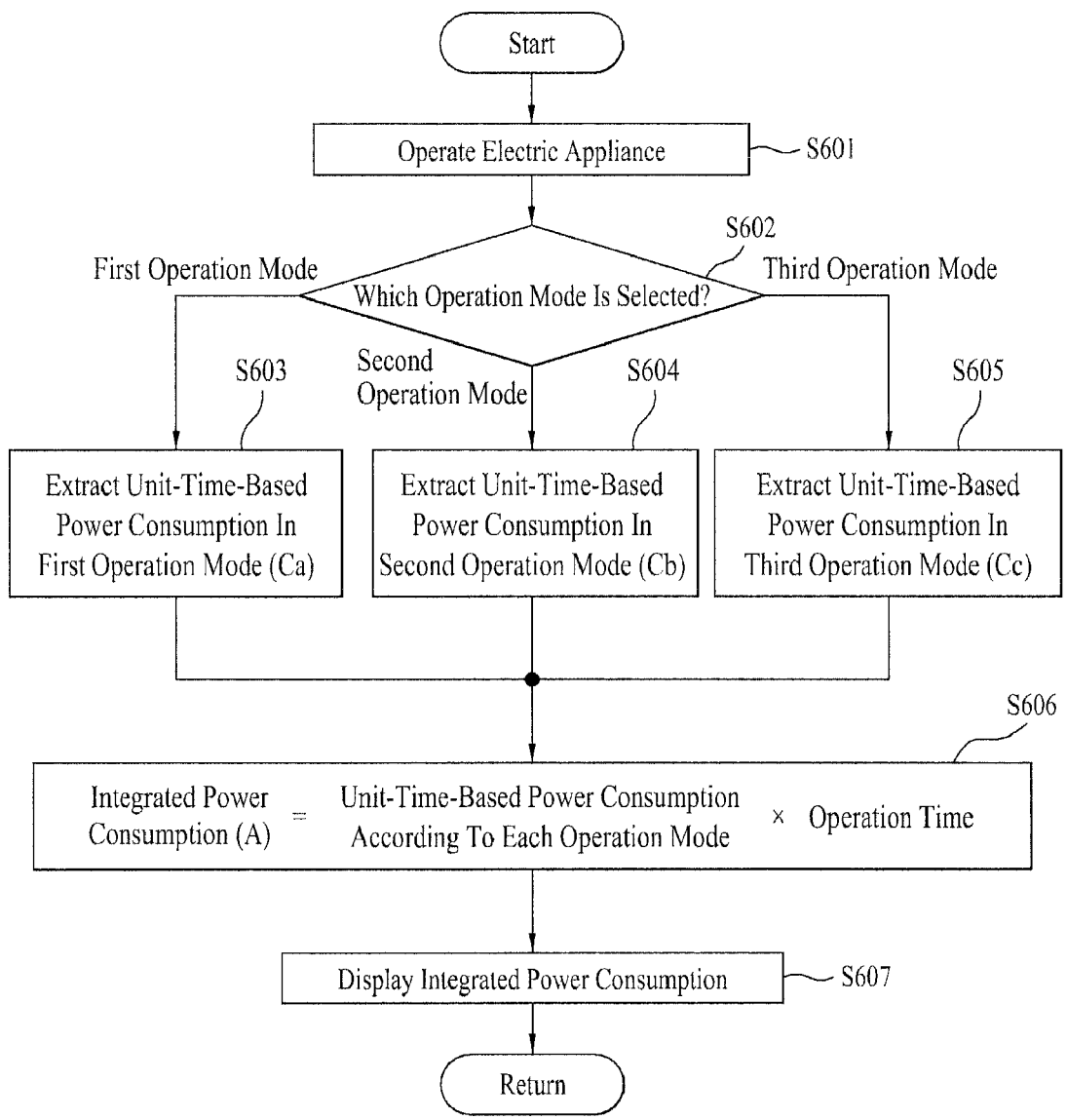
FIG. 6 is a flow chart of a process of calculating the electric power consumption for individual electric appliances in an electric power supply network system as embodied and broadly described herein.

As shown in FIG. 7, the individual integrated power consumptions of the electric appliances calculated as shown in FIG. 6 may be added up and the total value may be compared with the integrated power consumption actually used in the household. If there is a difference the calculated and actual integrated power consumption, the power consumptions per unit time of the electric appliances may be compensated.

First, the integrated power consumptions of each of the individual electric appliances may be determined by the process shown in FIG. 6 (S701) and the individual integrated power consumptions may be added up to a value (A) (S702).

A total value of the actual integrated power consumptions is measured by the smart meter 20 to determine a measured value (B) (S703).

The calculated value (A) is compared with the measured/actual value (B). When the values are the same, the total integrated power consumption is displayed on the EMS 30 (S712).

However, when the calculated value (A) is different from the actual value (B), a difference value (C) is calculated (S705) and a compensating value of the specific electric appliance may be determined based on the difference value (C) (S706).

The sum of the integrated power consumptions of the electric appliances is implemented once at a predetermined interval, and the summed value (A) is continuously compared with the total actual integrated power consumption value (B) measured in the step of S703.

A power consumption value of the specific electric appliance is divided by the summed value of the integrated power consumptions of the electric appliances, and the resulting value is multiplied by the difference value (C) to determine the integrated power consumption compensating value (D) of the specific electric appliance (S707).

The calculated integrated power consumption compensating value (D) is added to an integrated power consumption of the specific electric appliance based on the preset power consumption per unit time for the specific electric appliance, to determine a compensated integrated power consumption value (E) of the specific electric appliance (S708).

The integrated power consumption compensating value (E) of the specific electric appliance is multiplied by an operation time of each operation mode. After that, a determined value is added to the prior power consumption per unit time and a power consumption (F) per unit time of each electric appliance in each operation mode is determined (S709).

The compensated power consumption (F) of each electric appliance per unit time in each operation mode is transmitted to the EMS 30 or the smart meter 20 (S710), and is applied to the power consumption table of each electric appliance per unit time in each operation mode as shown in FIG. 5 to display the table including the newly applied values (S711 and S712). The integrated power consumptions of the electric appliances in each operation mode may be calculated by using the applied value.

For example, during the 24 hours of a single day, it is assumed that the refrigerator is operated in the first operation mode for 15 hours and in the second operation mode for 5 hours and in the third operation mode for 4 hours. Together with that, the air conditioner is operated in the second operation mode for 3 hours and in the third operation mode for 3 hours, and the washer is operated in the first operation mode for 2 hours and the electric oven is operated in the third operation for 3 minutes and the lighting apparatus is operated in the first operation mode for 5 hours. In this instance, a integrated power consumption for each electric appliance for this 24 hour period (i.e., the added up value) may be determined as follows:

Refrigerator=400 (W)×15 h+330 (W)×5 h+305 ($W$)×4 h=8.87 KWh

Air conditioner=1650 (W)×3 h+1500 (W)×3 h=9.45 KWh

Washer=2800 (W)×2 h=5.6 KWh

Electric Oven=15000 (W)×0.5 h=7.5 KWh

Lighting Apparatus=150 (W)×$h$5=0.75 KWh

These values may be calculated based on the table shown in FIG. 5. The sum of the integrated power consumption (A) of each appliance, in this example, is 33.27 KWh. When the total value calculated based on the sum of the integrated power consumptions measured by the smart meter 20 is 34 KWh (corresponding to the value (B) shown in FIG. 7), a corresponding compensating process is as follows:

Difference Value($C$)=$B-A$=34−32.17=1.83 KWh

Compensated Integrated Power Consumption value of Refrigerator ($D$1)=8.87/32.17×1.83=0.5 KWh Compensated Integrated Power Consumption value of Air Conditioner ($D$2)=9.45/32.17×1.83=0.54 KWh Compensated Integrated Power Consumption value of Air Conditioner ($D$3)=5.6/32/17×1.82=0.32 KWh Compensated Integrated Power Consumption value of Electric Oven ($D$4)=7.5/32.17×1.83=0.42 KWh Compensated Integrated Power Consumption value of Lighting Apparatus ($D$5)=0.75/32.17×1.83=0.04 KWh A compensated integrated power consumption of a specific electric appliance (E) in FIG. 7 may be determined as follows:

Compensated Integrated Power Consumption of Refrigerator ($E$1)=8.87+0.50=9.37 KWh Compensated Integrated Power Consumption of Air Conditioner ($E$2)=9.45+0.54=9.99 KWh Compensated Integrated Power Consumption of Washer ($E$3)=5.6+0.32=5.92 KWh Compensated Integrated Power Consumption of Electric Oven ($E$4)=7.5+0.42=7.92 KWh Compensated Integrated Power Consumption of Lightening Apparatus ($E$5)=0.75+0.44=0.79 KWh Hence, the power consumption of each electric appliance per unit time in each operation mode calculated based on each of the above values is as follows:

Power consumption of specific electric appliance per unit time=power consumption per unit time+ compensated integrated power consumption/ operation time.

In the refrigerator, 0.50 KWh/24 h=20.83 W are added to the power consumption per unit time in each operation mode. 0.54 KWh/6 h=90 W in the air conditioner, 0.32 KWh/2 h=160 W in the air conditioner, 0.32 KWh/2 h=160 W in the washer, 0.42 KWh/0.5 h=840 W in the electric oven and 0.04 KWh/5 h=8 W in the lighting device are added to the power consumption per unit time in each operation mode.

Through above process, the power consumption table of each electric appliance may be measured and compensated for by using the power consumption table per unit time, the electric power management software and the smart meter connected with the EMS connected with each electric appliance, without individual measuring devices installed in each of a plurality of electric appliances to measure power consumptions.

It will be apparent to those skilled in the art that various modifications and variations may be made without departing from the spirit or scope of embodiments as broadly described herein. Thus, it is intended that modifications and variations of embodiments as broadly described herein fall within the scope of the appended claims and their equivalents.

A system and method of measuring power consumption of an electric appliance is provided.

In a system and method of measuring power consumption of an electric appliance as embodied and broadly described herein, power consumption may be measured without any power consumption measuring device in the electric appliance.

In a situation in which there is a difference between power consumption and substantial power consumption of an electric appliance, a system and method as embodied and broadly described herein may apply and compensate the difference to allow a user to recognize more precise power consumption.

A system and method of measuring power consumption of an electric appliance as embodied and broadly described herein may include an operation mode determining step configured to determine an operation mode of the electric appliance; a data extracting step configured to extract power consumption data corresponding to the operation mode of the electric appliance; and a calculating step configured to calculate integrated power consumption in consideration of the extracted power consumption data and the operation time of the electric appliance.

In certain embodiments, the electric appliance may be operated in a predetermined operation mode, in which the data extracting step may include a step of extracting power consumption per unit time according to the predetermined operation mode from preset data, and the calculating step may include a step of calculating the integrated power consumption in consideration of the power consumption per unit time extracted from the data and the time required to implement the predetermined operation mode.

The data of the data extracting step may be extracted from a unit-time-based power consumption table stored in a smart meter or an energy management system (EMS) connected with the electric appliance.

The data of the data extracting step may be extracted from a unit-time-based power consumption table stored in a memory part provided in the electric appliance.

The integrated power consumption calculating step may multiply the unit-time-based power consumption by a value gained after dividing a total operation time by the unit time.

In certain embodiments, the electric appliance may be operated in a plurality of operation modes sequentially, in which the integrated power consumption calculating step may multiply unit-time-based power consumption used to operate each electric appliance in each operation mode by a value gained after dividing an operation time of each operation mode by the unit time, to calculate a total power consumption in each operation mode.

An interval of the calculating of the integrated power consumption may be 0.5 or 1 second.

The method may also include a displaying step configured to display the integrated power consumption calculated in the calculating step on a smart meter or an energy management system connected with the electric appliance communicably.

A system and method of measuring power consumption of an electric appliance in accordance with another embodiment as broadly described herein may include an operation mode determining step configured to determine which operation mode each of electric appliances is operated in; a data extracting step configured to extract power consumption per unit time required by the determined operation mode from preset data; a calculating/adding-up integrated power consumption in consideration of the unit-time-based power consumption of each electric appliance extracted from the data and the time required by the determined operation mode, in case each of the electric appliances is operated in a specific operation mode; and a data compensating step configured to calculate a compensating value by using a difference value, which can be generated by comparison between the added integrated power consumption and integrated power consumption substantially measured by a smart meter, and configured to compensate the stored unit-time-based power consumption of each electric appliance.

The data of the data extracting step may be extracted from a unit-time-based power consumption table stored in a smart meter or an energy management system connected with the electric appliance.

The data of the data extracting step may be extracted from a unit-time-based power consumption table stored in a memory part provided in the electric appliance.

The integrated power consumption calculating step may multiply the unit-time-based power consumption by a value gained after dividing a total operation time by the unit time.

In certain embodiments, the electric appliance may be operated in a plurality of operation modes sequentially, in which the integrated power consumption calculating step may multiply unit-time-based power consumption used to operate each electric appliance in each operation mode by a value gained after dividing an operation time of each operation mode by the unit time, to calculate a total power consumption in each operation mode.

The compensated integrated power consumption of each electric appliance in the data compensating step may be calculated by multiplying a value, which is gained after dividing an integrated power consumption of a specific electric appliance by a total integrated power consumption, by the difference value.

The data compensating step may include a step of applying the compensated integrated power consumption of each electric appliance to a unit-time-based power consumption table of each electric appliance and correcting a value of the unit-time-based power consumption table of each electric appliance In a system and method as embodied and broadly described herein, without individual measuring devices respectively installed in electric appliances, a power consumption of each electric appliance may be recognized by using stored unit-time-based power consumption data in each operation mode of each electric appliance.

As a result, a power consumption measuring device need not be installed in each electric appliance.

Furthermore, the unit-time-based power consumption data in each operation mode of each electric appliance may be measured substantially and it may be compensated continuously by using a difference between the total integrated power consumption and the calculated total integrated power consumption. As a result, more precise power consumption of each electric appliance can be recognized advantageously.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of controlling at least one appliance of a plurality of appliances in a network, the method comprising:
    determining an operation mode of each of the plurality of appliances;
    obtaining power consumption data corresponding to the determined operation mode of each of the plurality of appliances;
    calculating integrated power consumption of the plurality of appliances based on the power consumption data and a corresponding operation time of each of the plurality of appliances;
    measuring actual integrated power consumption of the plurality of appliances; and
    comparing the calculated integrated power consumption and the actual integrated power consumption and adjusting the power consumption data corresponding to the determined operation mode of each of the plurality of appliances when the comparison indicates there is a difference between the calculated and actual integrated power consumption.

2. The method of claim 1, wherein determining an operation mode of each of the plurality of appliances comprises determining an individual operational profile for each of the plurality of appliances over a predetermined period of time, each individual operational profile comprising operation of the respective appliance in a plurality of operation modes, each operation mode for a corresponding operation time.

3. The method of claim 2, wherein the plurality of operation modes comprises an energy saving mode, a normal mode in which operation is carried out irrespective of a power rate, and a rate saving mode in which operation is carried out so as to avoid operation during peak power rate times.

4. The method of claim 2, wherein obtaining power consumption data comprises obtaining power consumption data for each of the plurality of operation modes of each of the plurality of appliances.

5. The method of claim 2, wherein calculating integrated power consumption comprises determining individual power consumption for the individual operation profile of each of the plurality of appliances, and thereafter combining the individual power consumptions to determine the integrated power consumption.

6. The method of claim 5, wherein determining individual power consumption for the individual operation profile of each of the plurality of appliances comprises:
   determining an incremental power consumption for each operation mode of the individual operation profile by multiplying the power consumption data of the operation mode by its corresponding operation time; and
   adding all of the determined incremental power consumptions for the operation modes of the individual operation profile to determine the individual power consumption for the appliance.

7. The method of claim 6, wherein calculating integrated power consumption comprises adding the individual power consumptions of the plurality of appliances.

8. The method of claim 7, wherein comparing the calculated integrated power consumption and the actual integrated power consumption and adjusting the power consumption data corresponding to the determined operation mode of each of the plurality of appliances when the comparison indicates there is a difference between the calculated and actual integrated power consumption comprises:
   determining a compensation value to be applied to at least one of the plurality of appliances when the comparison indicates that the integrated power consumption is not equal to the actual integrated power consumption; and
   adjusting operation of at least one of the plurality of appliances based on the determined compensation value.

9. The method of claim 1, wherein obtaining power consumption data comprises obtaining power consumption data from a power consumption table stored in a smart meter or an energy management system (EMS) connected to one or more of the plurality of appliances, or from a memory provided in one or more of the plurality of appliances.

10. The method of claim 1, further comprising:
    displaying the integrated power consumption on a smart meter or an energy management system in communication with to one or more of the plurality of appliances.

* * * * *